United States Patent
Branchevsky

(10) Patent No.: US 6,408,511 B1
(45) Date of Patent: Jun. 25, 2002

(54) METHOD OF CREATING AN ENHANCED BGA ATTACHMENT IN A LOW-TEMPERATURE CO-FIRED CERAMIC (LTCC) SUBSTRATE

(75) Inventor: Shaul Branchevsky, Mission Viejo, CA (US)

(73) Assignee: National Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/643,387

(22) Filed: Aug. 21, 2000

(51) Int. Cl.[7] ............................................. H01R 9/00
(52) U.S. Cl. ...................... 29/843; 29/840; 29/830; 29/825; 29/846; 29/852; 438/613; 438/616; 438/617
(58) Field of Search ................... 29/843, 840, 830, 29/825, 852; 438/613, 688, 616, 617, 846; 174/261, 263, 264; 361/760, 761

(56) References Cited

U.S. PATENT DOCUMENTS

| | | | | |
|---|---|---|---|---|
| 4,237,606 A | * | 12/1980 | Niwa et al. ..................... 29/830 |
| 5,244,833 A | * | 9/1993 | Gansauge et al. ........... 437/183 |
| 5,293,025 A | * | 3/1994 | Wang ..................... 219/121.71 |
| 5,302,219 A | * | 4/1994 | Hargis ........................ 156/89 |
| 5,442,852 A | | 8/1995 | Danner ........................ 29/843 |
| 5,611,884 A | * | 3/1997 | Bearinger et al. ........... 156/325 |
| 5,637,832 A | | 6/1997 | Danner ........................ 174/260 |
| 5,658,827 A | * | 8/1997 | Aulicino et al. ......... 228/180.22 |
| 5,691,245 A | * | 11/1997 | Bakhit et al. ................ 437/209 |
| 5,744,758 A | * | 4/1998 | Takenouchi et al. ......... 174/255 |
| 5,817,404 A | * | 10/1998 | Kawakita et al. ........... 428/209 |
| 5,902,686 A | * | 5/1999 | Mis .............................. 428/629 |
| 5,925,930 A | * | 7/1999 | Farnworth et al. .......... 257/737 |
| 6,107,180 A | * | 8/2000 | Munroe et al. .............. 438/613 |
| 6,143,116 A | * | 11/2000 | Hayashi et al. ............. 156/233 |
| 6,181,569 B1 | * | 1/2001 | Chakravorty ................ 361/761 |
| 6,187,680 B1 | * | 2/2001 | Costrini et al. ............. 438/688 |
| 6,192,579 B1 | * | 2/2001 | Hayashi et al. ................ 29/846 |
| 6,341,417 B1 | * | 1/2002 | Gupta et al. ................... 29/830 |

* cited by examiner

Primary Examiner—Peter Vo
Assistant Examiner—Minh Trinh
(74) Attorney, Agent, or Firm—Beyer Weaver & Thomas, LLP

(57) ABSTRACT

A method for providing an enhanced ball grid array attachment in low-temperature co-fired ceramic (LTCC) substrate is provided. A termination cup is formed in a substrate. The termination cup has a bottom formed by a termination pad over a via in a first tape layer and side walls formed by termination sides formed over side walls of a via in a second tape layer. A diffusion layer is formed over the termination cup. The diffusion layer helps to reduce the oxidation of the termination cup and to provide greater mechanical attachment strength. An electrically conductive adhesive may be used to connect a solder ball to the diffusion layer. Reflow then is used to complete the solder ball connection process.

11 Claims, 6 Drawing Sheets

METHOD OF CREATING AN ENHANCED BGA ATTACHMENT IN A LOW-TEMPERATURE CO-FIRED CERAMIC (LTCC) SUBSTRATE

BACKGROUND OF THE INVENTION

1. Field of the Invention

The present invention relates generally to computer chips, and more particularly to ball grid arrays for attaching computer chips.

2. Description of the Related Art

Conventionally, electronic circuit components, including silicon chips, have been mounted on printed circuit boards. More recently, in order to reduce the size associated with conventional printed circuit boards, low-temperature co-fired ceramic (LTCC) substrates have been used.

A typical LTCC configuration comprises multiple layers of ceramic "tape" which are used to provide the base structure upon which to form various electronic components and electrical connections. The tape is formed from a powdered ceramic, mixed with a binder. For example, one type of ceramic tape available from Dupont is known as "Green Tape 951." The electronic components that can be formed include resistors, capacitors, inductors, and the like. The electrical connections, formed through each tape layer are known as "vias." The components are formed by punching holes in the tape as appropriate, and layering on metal, dielectrics, insulators, etc. Several layers of tape may be used in order to form the desired circuitry. The tape layers are then pressed together and fired in an oven to remove the binder and to sinter the ceramic powder. Components which are too large or too difficult to form within the ceramic tape layers, such as silicon chips, may be surface mounted on the hardened substrate. The resulting substrate is usually less than 1"×1" thus providing a compact circuit package.

U.S. Pat. No. 5,442,852, entitled "Method of Fabricating Solder Ball Array", by Paul Danner, discloses a method of forming a ball grid array on a ceramic substrate. To facilitate discussion, FIG. 1 shows an example of solder ball 100 being mounted on a ceramic substrate 104. A via 108 filled with an electrically conductive material may pass through the ceramic substrate 104. A termination pad 112 of an electrically conductive material may be placed over the via 108 to provide an electrical connection with the via 108. A dielectric tape 116 having holes matching the placement of the termination pads 116 on the ceramic substrate 104 may be mounted on the surface of the ceramic substrate 104 with the termination pad 116. The ceramic substrate 104 and dielectric tape 116 may be fired together. The solder ball 100 may be placed in the hole(s) in the dielectric tape 116. After the solder balls 100 are placed, the solder balls 100 may be reheated to reflow the solder balls 100 so that the solder balls 100 fill the volume created by the hole in the dielectric tape 116 and bonds with the termination pad 112, as shown in FIG. 2. The solder balls may be used as a ball grid array. Such ball grid arrays are subject to thermal stress and other environmental factors, which may cause a mechanical or electrical connection failure where the solder ball is connected to the termination pad.

It would thus be desirable to provide an enhanced ball grid array attachment between the solder balls and the termination pad.

SUMMARY OF THE INVENTION

In general, the present invention provides a method of forming a substrate with a ball grid array. Generally, a plurality of termination cups is formed on the substrate. A plurality of diffusion barriers is formed where each diffusion barrier is over a termination cup. Electrically conductive balls are then connected to the diffusion barriers.

These and other features of the present invention will be described in more detail below in the detailed description of the invention and in conjunction with the following figures.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide an ball grid array attachment for low temperature co-fired ceramic (LTCC) substrates.

Figure 1:
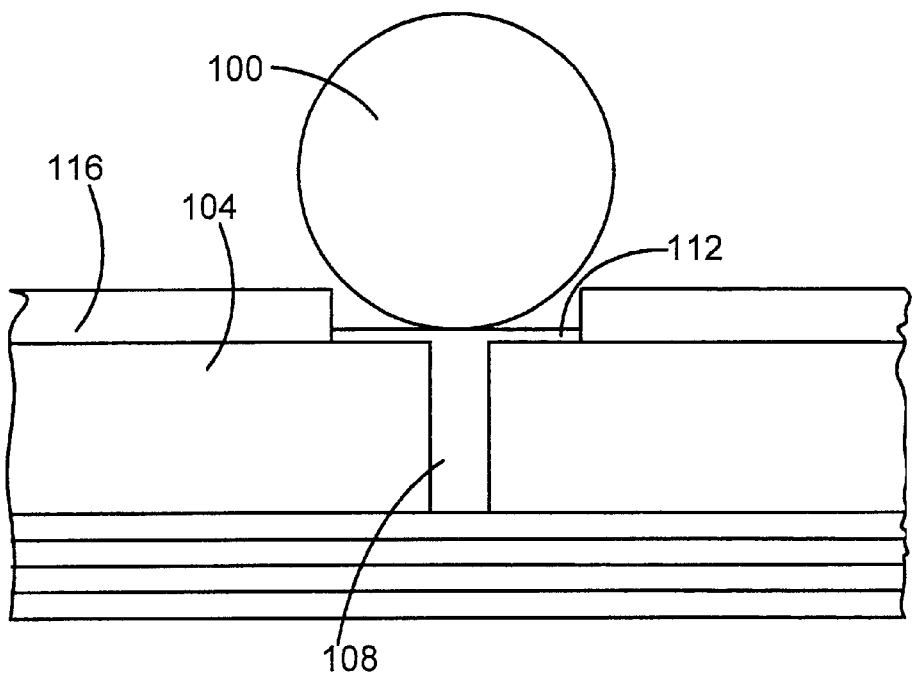
FIG. 1 is diagram of a prior art solder ball attachment.
Figure 2:
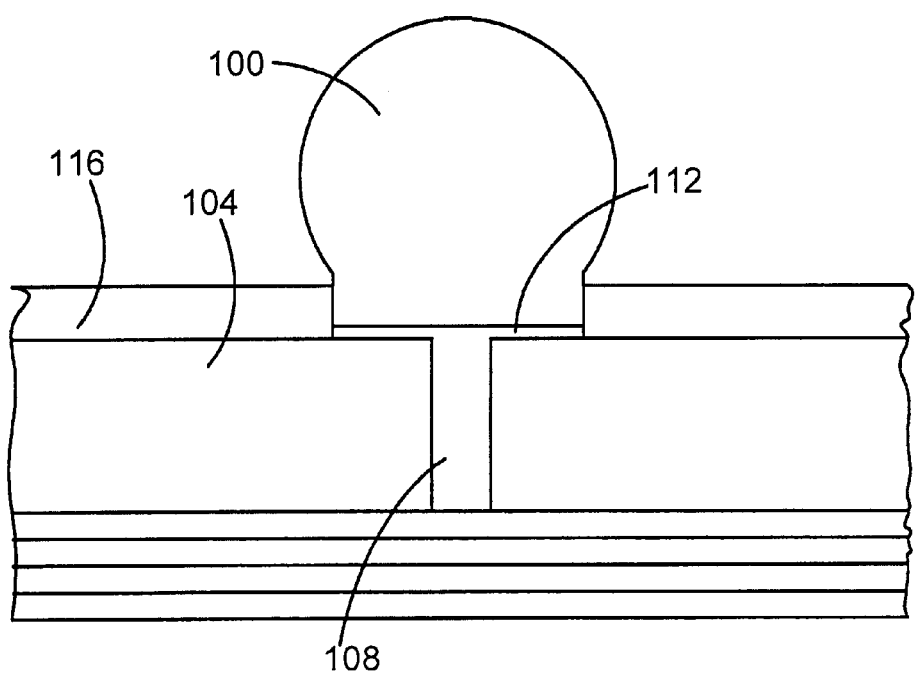
FIG. 2 is a diagram of the solder ball attachment of FIG. 1 after the solder ball has been reflowed.
Figure 3:
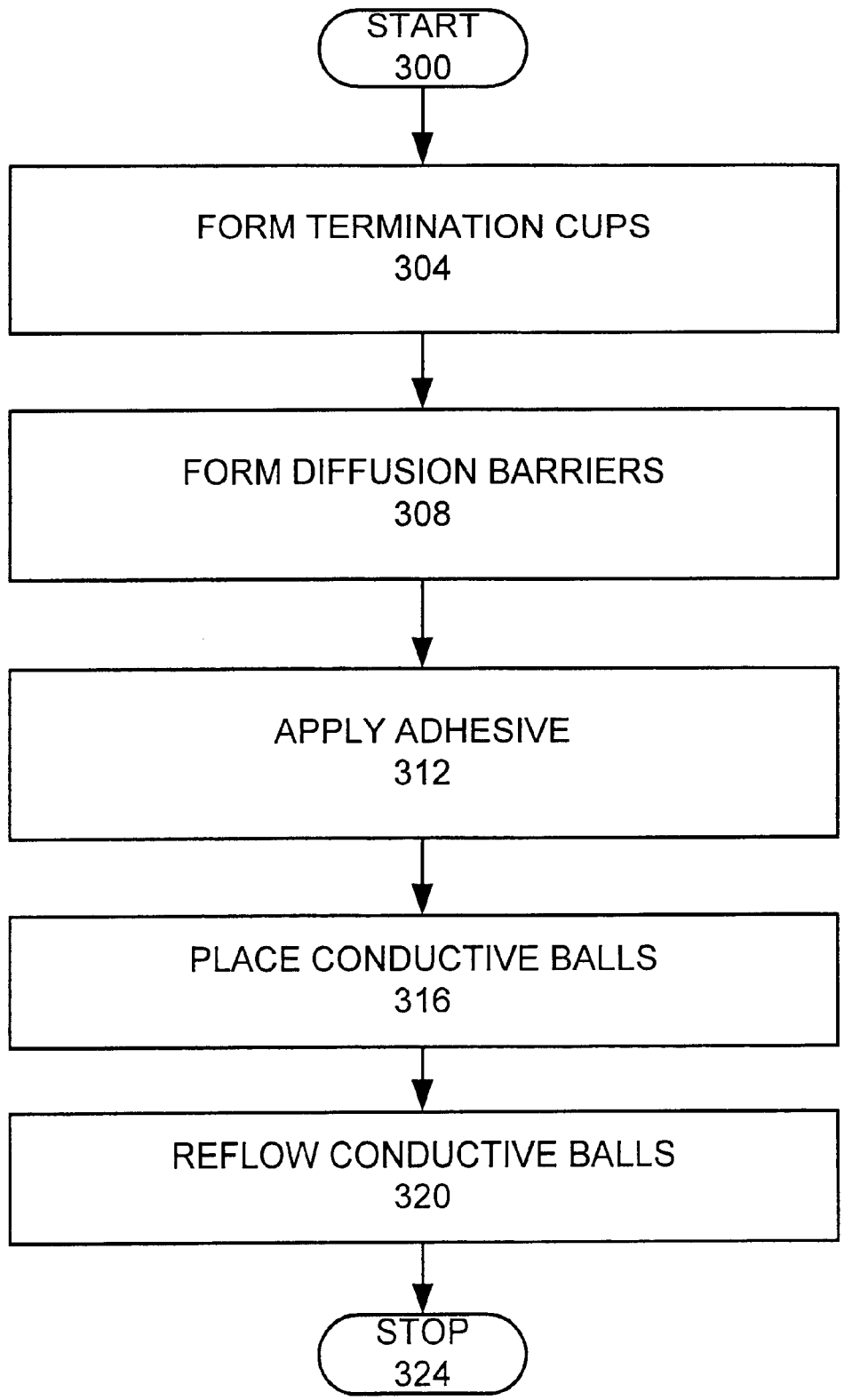
FIG. 3 is a high level flow chart of a preferred embodiment of the inventive process.
Figure 4:
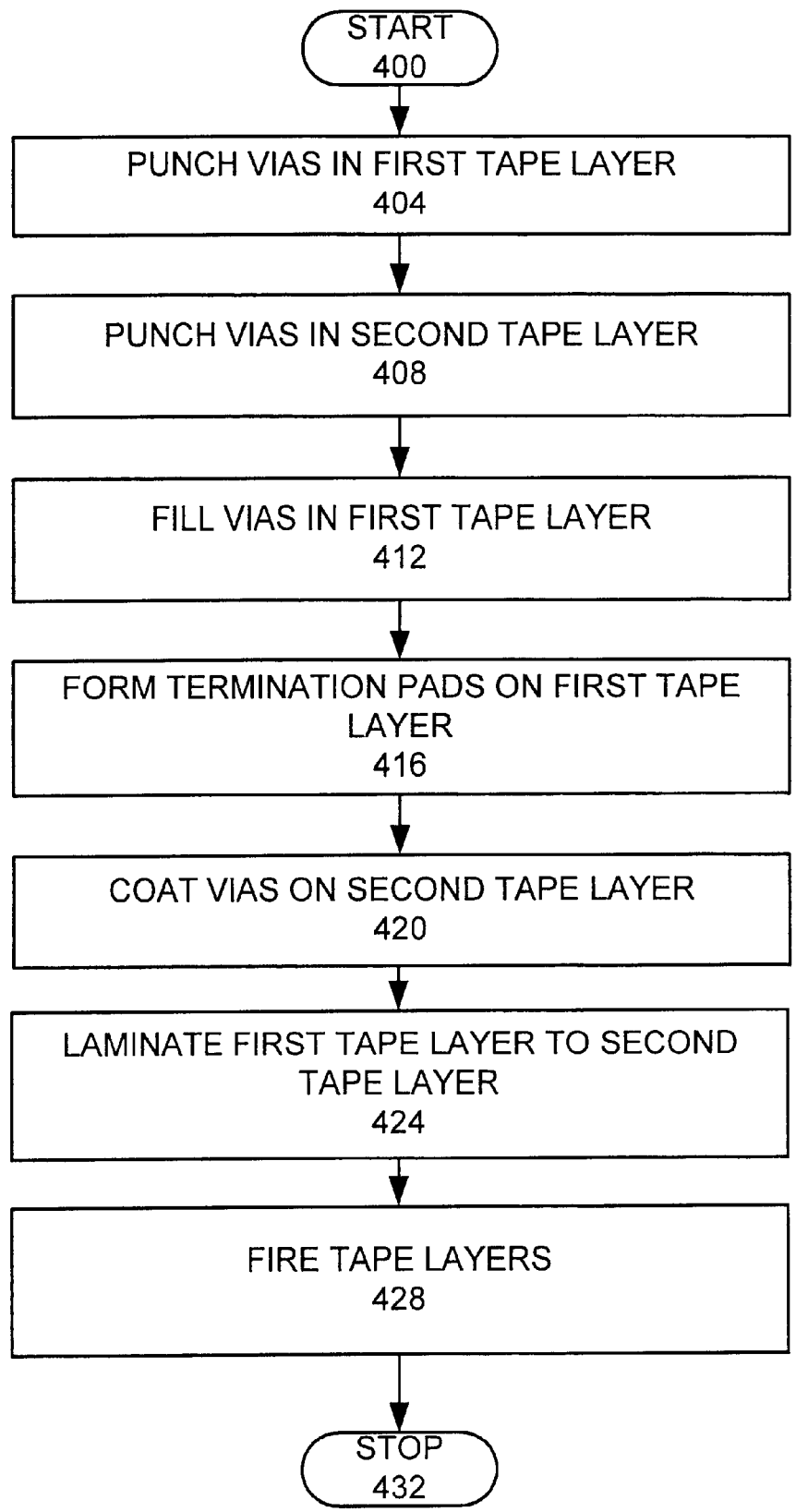
FIG. 4 is a flow chart of the process of forming termination cups.
Figure 5:
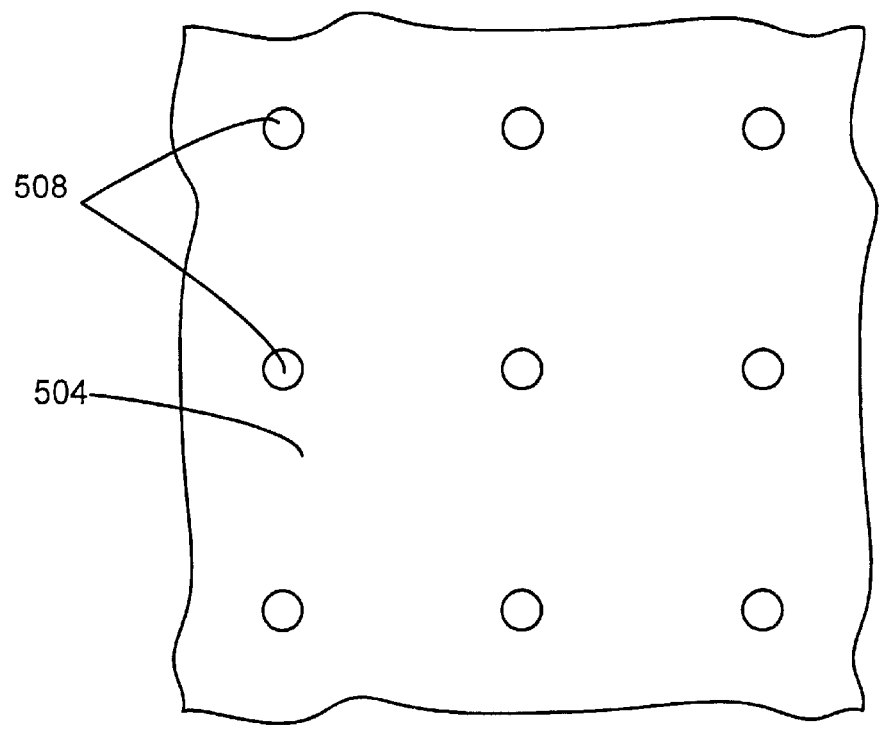
FIG. 5 is a top view of part of a first tape layer with an array of vias.

FIG. 3 is a high level flow chart of a preferred embodiment of the invention. First termination cups are formed on a ceramic substrate (step 304). FIG. 4 is a more detailed flow chart of the step of forming the termination cups (step 304). FIG. 5 is top view of part of a first tape layer 504. The first tape layer 504 may be formed from a powdered ceramic, mixed with a binder. One type of such ceramic tape available from Dupont™ is known as "Green Tape 951". Such a ceramic tape provides a Low Temperature Co-Fired Ceramic (LTCC) substrate. A plurality of vias 508 are formed in the first tape layer 504 (step 404). The vias 508 may be formed in an array, such as a square array, as shown in FIG. 5. The vias 508 may be formed by punching the vias or by other methods, such as by using a laser.

Figure 6:
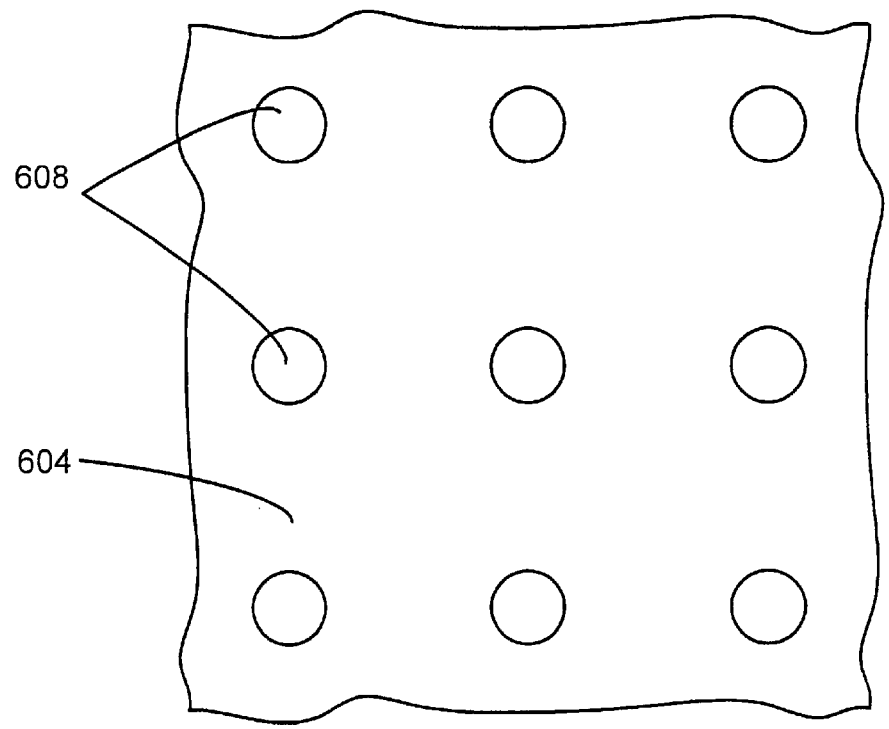
FIG. 6 is a top view of part of a second tape layer with an array of vias.

FIG. 6 is a top view of a second tape layer 604. The second tape layer 604 may be formed from a powdered ceramic, mixed with a binder. One type of such ceramic tape available from Dupont™ is known as "Green Tape 951". Such a ceramic tape provides a Low Temperature Co-Fired Ceramic (LTCC) substrate. A plurality of vias 608 are formed in the second tape layer 604 (step 408). The vias 608 may be formed in an array, such as a square array, as shown in FIG. 6. The vias 608 may be formed by punching the vias. In the preferred embodiment, the vias 608 in the second tape layer 604 have a wider diameter than the vias 508 in the first tape layer 504, preferably by more than one and a half times. In addition the array of the vias 608 in the second tape layer 604 is arranged so that the vias 608 in the second tape layer 604 match up with the vias 508 in the first tape layer 504.

Figure 7:
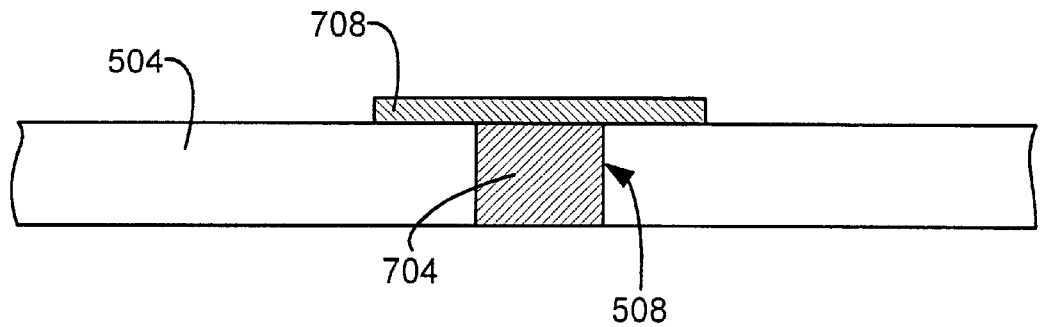
FIG. 7 is a cross-sectional view of the first tape layer with a termination pad.

FIG. 7 is a enlarged cross-sectional side view of part of the first tape layer 504 and a via 508. The vias 508 in the first tape layer 504 are filled with an electrically conductive material 704 (step 412). In the preferred embodiment the electrically conductive material 704 is silver. Other electrically conductive materials may be used. Termination pads 708 are placed over an end of the vias 508 in the first tape layer 504 (step 416). The termination pads 708 are formed from an electrically conductive material, which is preferably silver. The termination pads 708 form an electrically conductive connection with the conductive material 704, which fills the vias 508 in the first tape layer 504. The termination pads 708 have a diameter which is about the same as or larger than the diameter of the vias 608 in the second tape layer 604.

Figure 8:
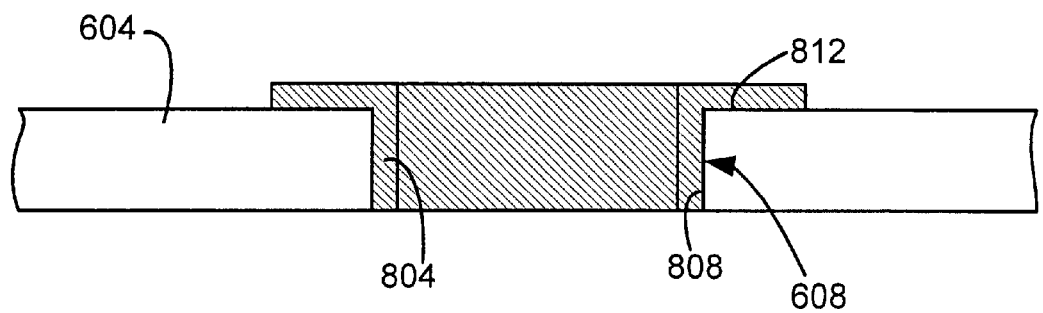
FIG. 8 is a cross-sectional view of the second tape layer with termination sides.

FIG. 8 is an enlarged cross-sectional side view of part of the second tape layer 604 and a via 608. The vias 608 in the second tape layer 604 are coated with termination sides 804, as shown in FIG. 8 (step 420), so that the side walls 808 of the vias 608 are coated. The termination sides 804 are formed from an electrically conductive material, which is preferably silver. There may be various ways of coating the side walls 808 of the vias 608 of the second tape layer 604. One method would be by depositing a termination layer over the vias 608 of the second tape layer 604 and applying a vacuum to the vias 608 to draw the termination layer to coat the side walls 808 of the vias 608. Preferably, part of a first surface 812 of the second tape layer 604 around the vias 608 are also coated by part of the termination sides 804. Preferably, the termination sides form a ring around the vias 608, with a hole at the center of the ring. A second surface opposite from the first surface may also be partly coated with the termination sides.

Figure 9:
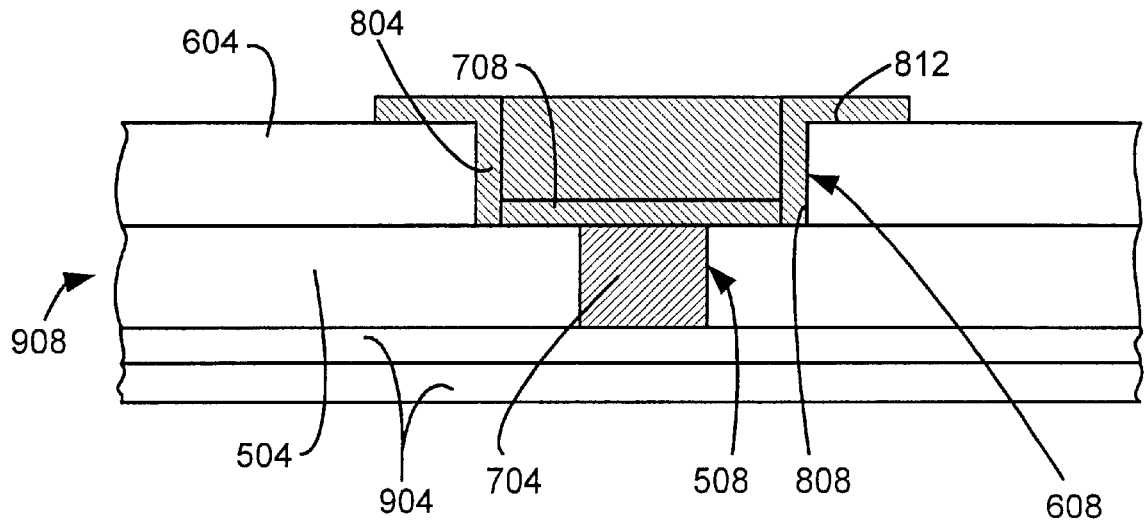
FIG. 9 is a cross-sectional view of a ceramic substrate formed from the first tape layer and the second tape layer.

The first tape layer 504 may then be placed next to the second tape layer 604 (step 424), as shown in FIG. 9. The first tape layer 504 and the second tape layer 604 are placed adjacent to each other so that the termination pads 708 are placed between, the first tape layer 504 and the second tape layer 604 and so that the first surface 812 is placed away from the first tape layer 504 and the second surface is placed adjacent to the first tape layer 504 and the termination ads 708. The first tape layer 504 may be held to the second tape layer 604 by lamination or pressing. The termination pads 708 have a diameter that allows the termination pads 708 to extend across the hole in the termination sides 804. Other ceramic tape layers 904 may be laminated to the first and second tape layers 504, 604 to form additional parts of a substrates with additional electrical circuits to form a ceramic substrate 908.

The first tape layer 504 and the second tape layer 604 may then be placed in an oven and heated for firing or sintering (step 428). The firing hardens the ceramic substrate 908. The heat also may cause the termination pads 708 to merge with the termination sides 804 to form termination cups (step 304), where each termination cup is a combined termination pad 708 with a termination side 804. A filler material may be placed in the termination cup before lamination/pressing, to help maintain the cup shape. The filler material may the be removed during or after firing.

Figure 10:
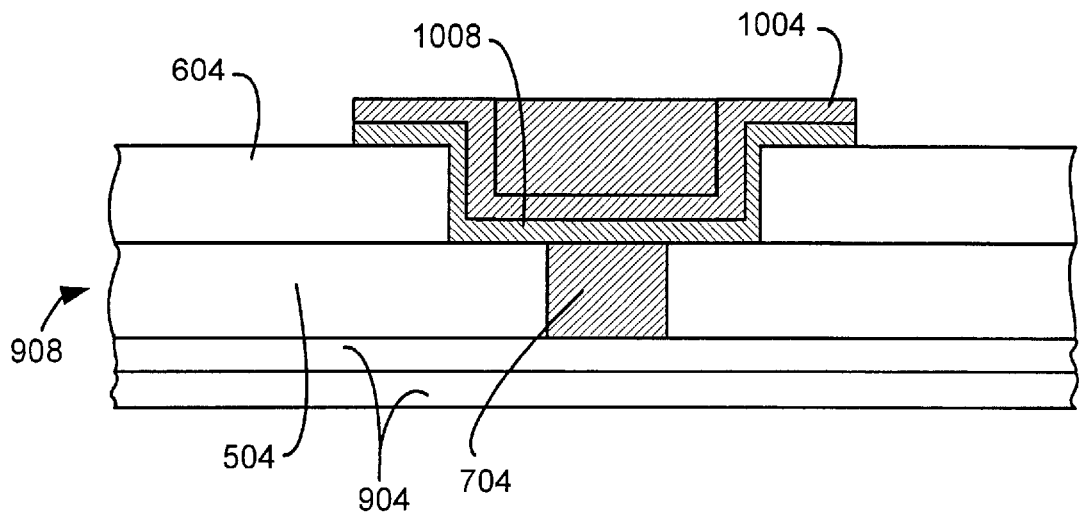
FIG. 10 is a cross-sectional view of the ceramic substrate of FIG. 9 with a diffusion layer.

A diffusion barrier 1004 is formed over each termination cup 1008 (step 308), as shown in FIG. 10. In the preferred embodiment, the diffusion barrier 1004 is made of nickel, which is deposited by electroplating or electroless. The diffusion barrier is electrically conductive and, provides more mechanical strength between the termination cup 1008 and a solder ball. The diffusion barrier 1004 may be made of other electrically conductive materials that provide more mechanical strength between the termination cup 1008 and a solder ball.

Figure 11:
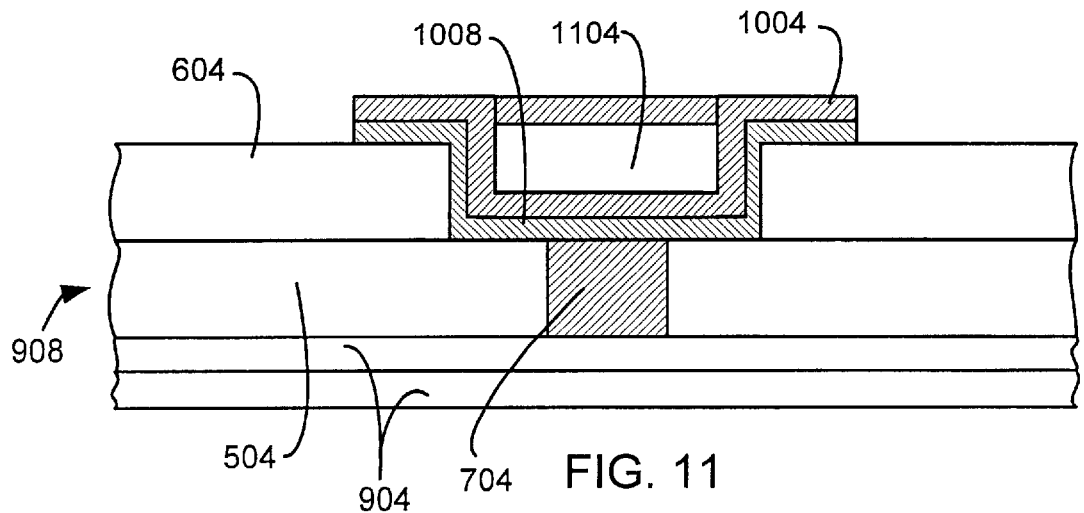
FIG. 11 is a cross-sectional view of the ceramic substrate of FIG. 10, with an adhesive.
Figure 12:
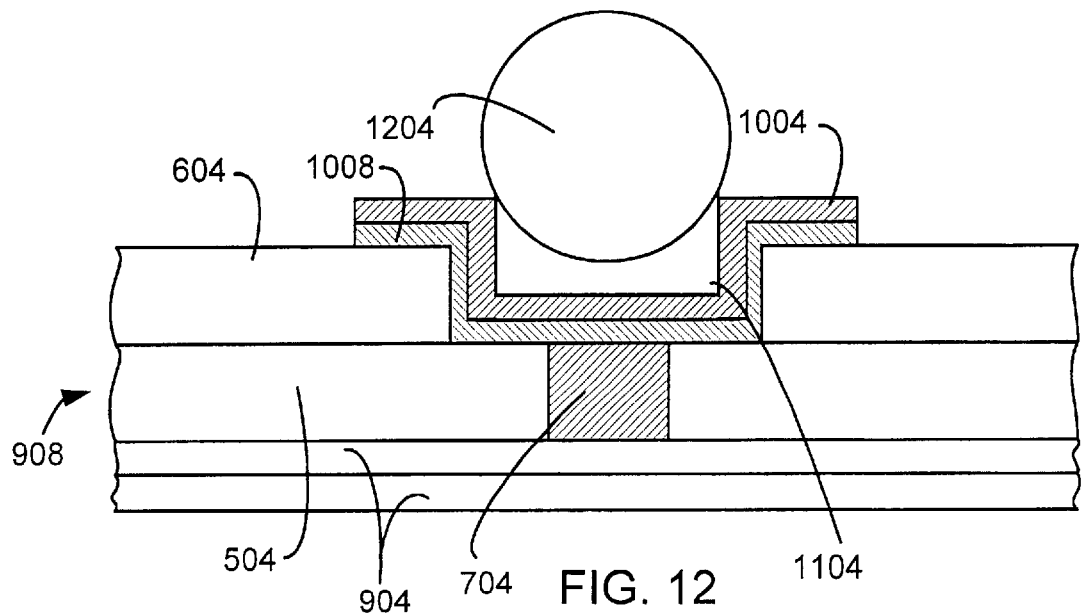
FIG. 12 is a cross-sectional view of the ceramic substrate of FIG. 11, with an electrically conductive ball.

An adhesive material 1104 is placed in the termination cups 1008 with diffusion barriers 1004 (step 312), as shown in FIG. 11. Preferably, the adhesive material is electrically conductive, like solder paste or electrically conductive epoxy. Balls 1204 of electrically conductive material, such as a solder balls, are placed in the adhesive material 1104 (step 316), as shown in FIG. 12. The electrically conductive balls 1204 on the substrate 908 form a ball grid array. The substrate with the ball grid array may be placed on a circuit board. The balls 120 in the ball grid array may then be reflowed (324) to establish an electrical and mechanical connection between the substrate and the circuit board.

In another embodiment, termination cups may be formed on two sides of a ceramic substrate. This allows the formation of ball grid arrays on two sides of the substrate. Electrically conductive balls may then be used to mount a die on one side of the substrate and allow a ball grid array to mount the substrate to a circuit board.

Another layer of electrically conductive material, such as gold, may be placed over the diffusion barrier to protect the diffusion barrier from oxidation and increase solderability.

By providing a termination cup the attachment between the balls and the substrate is improved. By adding a diffusion barrier the attachment between the ball and the substrate is further improved. By providing an additional protective layer, the attachment between the ball and the substrate may be further improved.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method of forming a substrate for a ball grid array, comprising the steps of:

punching an array of vias in a first tape layer;

filling the vias in the first tape layer with an electrically conductive material;

forming a plurality of termination pads, wherein each termination pad is over a via of the array of vias in the first tape layer, and wherein the plurality of termination pads are on a first side of the first tape layer;

punching an array of vias in a second tape layer;

forming a plurality of termination sides, wherein each termination side of the plurality of termination sides is formed on a side wall of a via of the array of vias in the second tape layer;

placing the first tape layer adjacent to the second tape layer; and firing the first tape layer and the second tape layer so that the plurality of termination sides and the plurality of termination pads form a plurality of termination cups over the vias of the first tape layer and at least partially within the vias of the second tape layer;

forming a plurality of diffusion barriers, wherein each diffusion barrier is over a termination cup of the plurality of termination cups; and electrically and mechanically connecting an electrically conductive ball to each of the diffusion barriers.

2. The method, as recited in claim 1, wherein the step of electrically and mechanically connecting the electrically conductive ball to each of the diffusion barriers, comprises a step of applying an adhesive between said electrically conductive ball and said diffusion barrier.

3. The method, as recited in claim 1, wherein in the step of placing the first tape layer adjacent to the second tape layer, the vias of the array of vias in the first tape layer are placed adjacent to the vias of the array of vias in the second tape layer.

4. The method, as recited in claim 1, wherein in the step of placing the first tape layer adjacent to the second tape layer, each termination side of the plurality of termination sides is placed in contact with a termination pad of the plurality of termination pads.

5. The method, as recited in claim 4, wherein the vias of the array of vias in the second tape layer have a wider diameter than diameters of the vias of the array of vias in the first tape layer.

6. The method, as recited in claim 5, wherein the step of placing the first tape layer adjacent to the second tape layer comprises the step of laminating the first tape layer to the second tape layer.

7. The method, as recited in claim 6, wherein the plurality of termination cups are made of silver.

8. The method, as recited in claim 7, wherein the diffusion layer is made of nickel.

9. The method, as recited in claim 8, wherein the adhesive is from a group consisting of solder and electrically conductive epoxy.

10. The method, as recited in claim 9, wherein the electrically conductive balls are solder balls.

11. The method, as recited in claim 10, further comprising a step of reflowing the electrically conductive balls.

* * * * *